(12) United States Patent
Wood et al.

(10) Patent No.: US 11,477,895 B2
(45) Date of Patent: Oct. 18, 2022

(54) MODULAR KMM SYSTEM HAVING REMOVABLE KMM CONSOLE

(71) Applicant: VERTIV IT SYSTEMS, INC., Wilmington, DE (US)

(72) Inventors: Christopher Wood, Madison, AL (US); Christopher A Dejesus, Huntsville, AL (US); Amanda L. Conger, Huntsville, AL (US); Dan Bidwell, Huntsville, AL (US); Jonathan Osborne, Madison, AL (US)

(73) Assignee: VERTIV IT SYSTEMS, INC., Huntsville, AL (US)

( * ) Notice: Subject to any disclaimer, the term of this patent is extended or adjusted under 35 U.S.C. 154(b) by 0 days.

(21) Appl. No.: 16/267,000

(22) Filed: Feb. 4, 2019

(65) Prior Publication Data

US 2019/0246510 A1 Aug. 8, 2019

Related U.S. Application Data

(60) Provisional application No. 62/626,342, filed on Feb. 5, 2018.

(51) Int. Cl.
*H05K 5/00* (2006.01)
*H05K 5/02* (2006.01)
*G06F 1/16* (2006.01)

(52) U.S. Cl.
CPC ......... *H05K 5/0204* (2013.01); *G06F 1/1656* (2013.01); *H05K 5/0065* (2013.01)

(58) Field of Classification Search
None
See application file for complete search history.

(56) References Cited

U.S. PATENT DOCUMENTS 6,201,690 B1 * 3/2001 Moore .................. A47B 81/061
361/679.21
6,563,700 B1 * 5/2003 Waller .................. H05K 7/1494
361/679.09

(Continued)

FOREIGN PATENT DOCUMENTS

KR 19980052983 U 10/1998

OTHER PUBLICATIONS

International Search Report and Written Opinion for corresponding PCT International Application No. PCT/US2019/016643 dated May 9, 2019, 9 pp.

*Primary Examiner* — Anthony Q Edwards
*Assistant Examiner* — Rashen E Morrison
(74) *Attorney, Agent, or Firm* — Harness, Dickey & Pierce, P.L.C.

(57) ABSTRACT

The present disclosure relates to a modular keyboard, monitor, mouse (KMM) system for use in an equipment rack. The system may have a tray subsystem and an electronics subsystem adapted to rest on and be removably secured to the tray subsystem. The electronics subsystem has a housing including a recess, the recess being shaped to nestably support a keyboard therein. A monitor is pivotally supported from the electronics subsystem and movable between a first position, extending up from the electronics subsystem so as to be viewable for use by a user, to a second position for storage such that the monitor is positioned parallel to the housing of the electronics subsystem. A keyboard is removably secured to the electronics subsystem within the recess. The monitor covers at least a substantial portion of the keyboard when folded down into the second position for storage.

20 Claims, 4 Drawing Sheets

(56) References Cited

U.S. PATENT DOCUMENTS

| | | | | |
|---|---|---|---|---|
| 6,856,505 B1* | 2/2005 | Venegas | G06F 1/183 | 361/679.05 |
| 7,019,963 B2* | 3/2006 | Lee | G06F 1/16 | 361/679.06 |
| 7,201,279 B1 | 4/2007 | Mimlitch, III et al. | | |
| 7,256,986 B2* | 8/2007 | Williams | G06F 1/16 | 248/222.12 |
| 7,414,853 B2* | 8/2008 | Lee | G06F 3/0227 | 361/726 |
| 7,633,760 B2* | 12/2009 | Wu | G06F 1/182 | 384/19 |
| 7,675,742 B2* | 3/2010 | Wu | G06F 1/16 | 345/169 |
| 7,808,793 B2* | 10/2010 | Nagao | G06F 1/16 | 361/679.21 |
| 8,300,392 B2* | 10/2012 | Weng | G06F 1/1666 | 361/679.08 |
| 8,848,376 B2* | 9/2014 | Lee | G06F 1/1679 | 248/205.2 |
| 8,971,026 B2* | 3/2015 | Matsuoka | G06F 1/181 | 361/679.09 |
| 8,995,125 B2* | 3/2015 | Matsuoka | G06F 1/1658 | 361/679.55 |
| 9,047,045 B2* | 6/2015 | Gambon | G06F 1/1601 | |
| 9,823,717 B2* | 11/2017 | Lin | G06F 1/203 | |
| 2001/0029128 A1 | 10/2001 | Horiuchi et al. | | |
| 2003/0059242 A1 | 3/2003 | Horiuchi et al. | | |
| 2004/0190239 A1* | 9/2004 | Weng | G06F 1/1669 | 361/679.2 |
| 2005/0035262 A1* | 2/2005 | Seki | G06F 1/18 | 248/441.1 |
| 2006/0117085 A1* | 6/2006 | Nagao | G06F 1/16 | 709/203 |
| 2009/0190294 A1 | 7/2009 | Ruch et al. | | |
| 2010/0177045 A1 | 7/2010 | Lu | | |
| 2010/0277858 A1* | 11/2010 | Zhou | G06F 1/1669 | 361/679.17 |
| 2011/0023272 A1* | 2/2011 | Huang | E05D 11/087 | 16/362 |
| 2011/0194237 A1* | 8/2011 | Weng | G06F 1/1666 | 361/679.08 |
| 2013/0257733 A1* | 10/2013 | Moore | G06F 1/1618 | 345/168 |

\* cited by examiner

MODULAR KMM SYSTEM HAVING REMOVABLE KMM CONSOLE

CROSS-REFERENCE TO RELATED APPLICATIONS

This application claims the benefit of U.S. Provisional Application No. 62/626,342, filed on Feb. 5, 2018. The entire disclosure of the above application is incorporated herein by reference.

FIELD

The present disclosure relates to keyboard, monitor and mouse systems, and more particularly to a modular keyboard, monitor and mouse console for providing a user interface to a computing component.

BACKGROUND

The statements in this section merely provide background information related to the present disclosure and may not constitute prior art.

A Keyboard-Monitor-Mouse ("KMM") system is a console-like system that allows an end user to access, view, and interact with a target device such as a server, computer, or networked device. Typically the conventional KMM system is mounted in a standard equipment rack along with the device (e.g., server) that it is communicating with.

The typical KMM system on the market today is relatively heavy and awkward to install into, and remove from, a computer equipment rack. Typically, two persons are required to handle the KMM system during installation into a computer equipment rack because of its weight, size, and complex cable management system. Furthermore, when a KMM System fails, the entire assembly must be removed for service or replacement, a difficult and time-consuming process that may disrupt or even disable a customer's access to critical network systems and functions.

To avoid, or at least minimize, network down time, it would be highly advantageous if the KMM system could be modified in a way which makes its physical handling, installation and removal from an equipment rack easier and able to be accomplished by a single individual. It would further be desirable if the various portions of the KMM system could be separated out from one another in the event that only a specific subportion of the system requires service and/or maintenance. Such an ability to remove only a subsystem or portion of a KMM system, when needed, would also save costs on shipping the selected subsystem to a service facility, as the entire KMM system would not need to be packaged and sent but rather only the subsystem/portion requiring service or maintenance.

SUMMARY

In one aspect the present disclosure relates to a modular keyboard, monitor, mouse (KMM) system for use in an equipment rack. The system may have a tray subsystem and an electronics subsystem adapted to rest on and be removably secured to the tray subsystem. The electronics subsystem has a housing including a recess, the recess being shaped to nestably support a keyboard therein. A monitor is pivotally supported from the electronics subsystem and movable between a first position, extending up from the electronics subsystem so as to be viewable for use by a user, to a second position for storage such that the monitor is positioned parallel to the housing of the electronics subsystem. The monitor covers at least a substantial portion of a keyboard positioned in the recess when the monitor is folded down into the second position for storage.

In another aspect the present disclosure relates to a modular keyboard, monitor, mouse (KMM) system for use in an equipment rack. The system may comprise a tray subsystem and a pair of slides for supporting the tray subsystem for sliding movement into and out from the equipment rack. The system may further comprise an electronics subsystem adapted to rest on and be removably secured to the tray subsystem, where the electronics subsystem has a housing including a recess, the recess being shaped to nestably support a keyboard therein. The housing may include a rear edge having a plurality of electrical connectors. The housing may also include a control panel disposed on an upper surface thereof adjacent the keyboard. A monitor may be included which is pivotally supported from the electronics subsystem. The monitor may be movable between a first position, extending up from the electronics subsystem so as to be viewable for use by a user, to a second position for storage such that the monitor is positioned parallel to the housing of the electronics subsystem. A keyboard may be removably secured to the electronics subsystem within the recess, the monitor covering at least a substantial portion of the keyboard when folded down into the second position for storage.

In still another aspect the present disclosure relates to a method for forming a modular keyboard, monitor, mouse (KMM) system for use in an equipment rack. The method may comprise providing a tray subsystem and securing the tray subsystem to an equipment rack for slidable movement out from an equipment location of the equipment rack, and back into the equipment location. The method may further comprise securing an electronics subsystem removably on the tray subsystem, and providing the electronics subsystem with a recess which is adapted to removably support a keyboard therein. The method may further comprise pivotally securing a monitor to the electronics subsystem such that the monitor is movable between a first position extending out from the electronics subsystem to enable the monitor to be positioned for viewing by a user, and a second position wherein the monitor is folded down flush against the electronics subsystem for storage. The second position enables the tray subsystem with the electronics subsystem thereon, and a keyboard disposed on the electronics subsystem, to be slid into the equipment location of the equipment rack as a single assembly for storage.

This section provides a general summary of the disclosure, and is not a comprehensive disclosure of its full scope or all of its features.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 1:
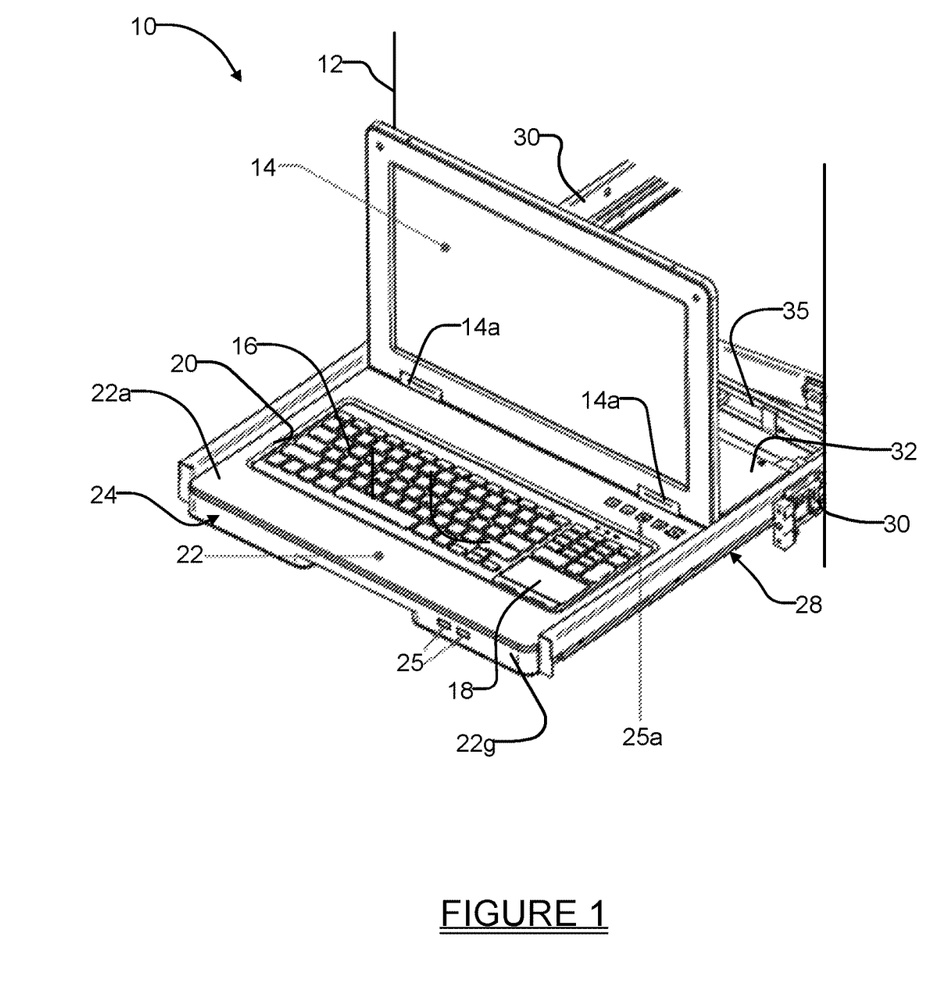
FIG. 1 is a front perspective view of one embodiment of a KMM system in accordance with the present disclosure in assembled form, which is being used to support a compact keyboard.

Referring to FIG. 1 there is a perspective view of one embodiment of a keyboard, monitor, mouse ("KMM") system 10 in accordance with the present disclosure. The novel KMM System forms a modular system having a plurality of subcomponents that can be separated to significantly ease assembly and service of specific subsystems of the KMM system 10. The KMM system 10 is intended to be installed in a standard equipment rack, for example within a 19 inch (48.26 cm) EIA compliant rack cabinet system, such as indicated by reference number 12 in FIG. 1 (e.g., server rack), and occupies only a single "U" space of the equipment rack 12. A single U space of such an equipment rack is 1.75 inch (44.5 mm) high by 19 in 48.26 cm) wide. The KMM System 10 may extend out from and retract into the "U" rack mount space, as will be explained further in the following paragraph, so that the KMM system 10 can be deployed for use by an individual, that is, projecting partially or fully out from a front end of the equipment rack 12, or positioned fully within the U space of the equipment rack 12 when not needed. When fully retracted into its U space, the KMM system 10 allows the front door (not shown) of the equipment rack 12 to be closed.

Figure 2:
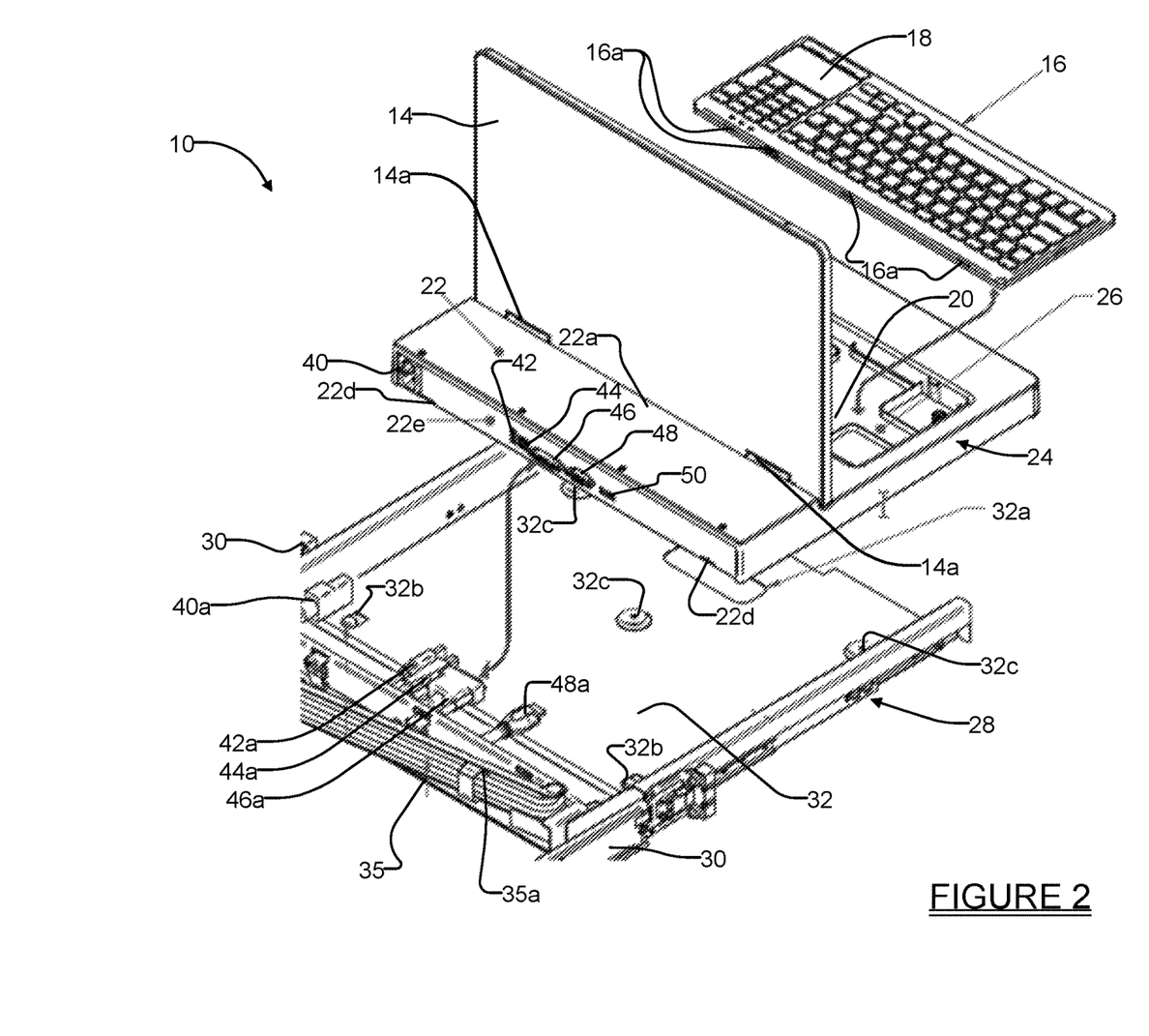
FIG. 2 is an exploded perspective rear view of the KMM system of FIG. 1.
Figures 3, 4, 5:
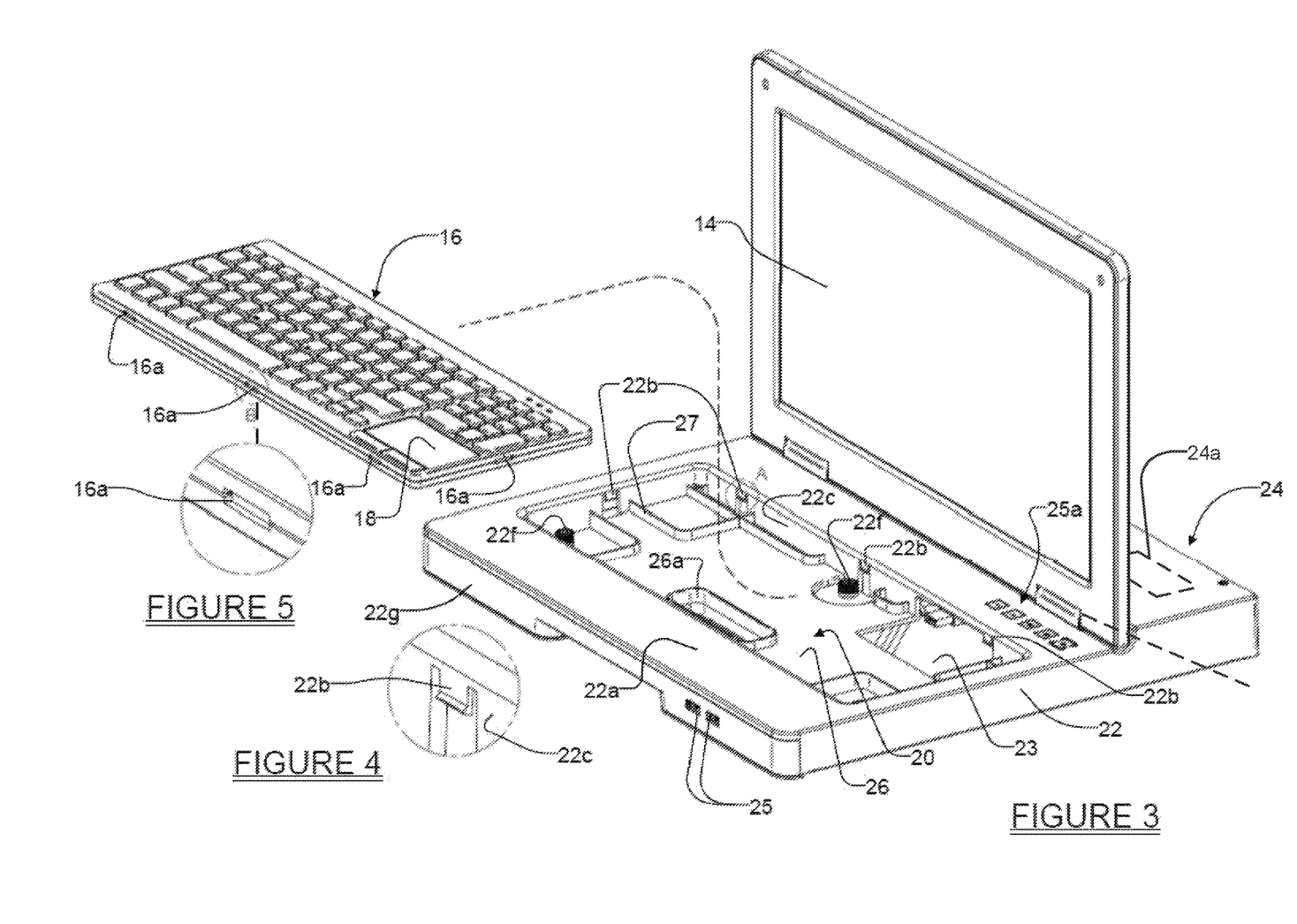
FIG. 3 is an exploded perspective front view of the just the electronics subsystem and the keyboard of the KMM system of FIG. 1.
FIG. 4 is an enlarged perspective view of one of the retaining arms located in the housing of the electronics subsystem.
FIG. 5 is an enlarged perspective view of one of the recesses formed in the perimeter of the keyboard which engages with a corresponding one of the retaining arms to retain the keyboard attached to the electronics subsystem of the KMM system.

Referring further to FIGS. 1-3, the KMM system 10 forms a console-like system having a pivotally mounted monitor 14 supported by hinge components 14a, a first input device such as a keyboard 16, and a second input device such as a touch sensitive mouse/cursor surface 18. The keyboard 16 in this example is a compact keyboard and rests removably within a recess 20 in a housing 22 of an electronics subsystem 24. In this example the monitor 14 forms a pivotally mounted flat panel LCD monitor such as those typically used with present day laptop computers. The monitor 14 may be folded down flush against the keyboard 16 when not needed, and raised into the position shown in FIGS. 1-3 when needed for use. When the monitor 14 is in its lowered position it rests generally co-planar with an upper surface 22a of the housing 22 which allows the KMM system 10 to be easily slid into its U space in the equipment rack 12 for storage. It will also be appreciated that the monitor 14 could also be configured to be readily removable from the housing 22, and thus easily separated without external tools, or with only the need for simple hand tools (e.g., screw driver). In such an embodiment, a connector which allows pivoting movement of the monitor 14 may be employed with the monitor together with a suitable connector or cable (e.g., ribbon cable), which allows quick and easy detachment and reattachment of the monitor. This would allow the monitor 14 to be removed for service and/or replaced with an updated monitor.

Referring further to FIGS. 1 and 2, the entire housing 22 of the electronics subsystem 24 may be supported on a tray subsystem 28 having a pair of drawer slides 30 and a tray portion 32. The drawer slides 30 may be engaged with mating slides mounted in the equipment rack 12 at the U space where the KMM system 10 is to be located. A cable management subsystem 35 including a folding arm 35a may be included to help manage cabling extending from the KMM system 10 when the tray portion 32 is extended out from and retracted back into the equipment rack 12.

Referring to FIGS. 2 and 3, the recess 20 in the housing 22 of the electronics subsystem 24 may include an opening 26a (FIG. 3) in a floor panel 26, and the tray portion 32 may likewise include an opening 32a (FIG. 2) which is aligned with the opening 26a in the floor panel 26. Openings 26a and 32a enable tool free access to a portion of an underside of the keyboard 16. This allows an individual to use one or more fingers to reach through the openings 26a and 32a and to help lift the keyboard 16 out of the recess 20 if the need to replace the keyboard arises.

The keyboard 16 may be coupled to the electronics subsystem 24 via a length of cabling, (e.g., a USB cable) which extends through an opening 23 in the housing 22, as shown in FIG. 3. Alternatively, the keyboard 16 may include a fixedly mounted USB connector portion, for example, a male or female USB connector portion (not shown), while a mating connector portion is fixedly located in the recess 20. This would enable the entire keyboard 16 to be dropped into the recess 20 and automatically electrically coupled to the KMM electronics subsystem 24 as soon as the keyboard 16 is fully seated in the recess. The specific style of connector (s) used may be USB-A, USB-B, USB-Micro, USB-Mini, USB-C, Thunderbolt, or virtually any other style of connector which is suitable for connecting a keyboard to a processing system. Still further, a custom or proprietary connector could be used as well. Optionally but preferably, one or more additional communications ports 25, for example USB ports, may be positioned along a front area 25g of the housing 22 for access after the electronics subsystem 24 is installed on the tray subsystem 28. A bank of controls 25a may be provided on the housing 22 as well for power on/off, configuration, settings, etc. Controls 25a may be capacitive, touch sensitive controls or any other type of controls which provide a low profile.

As shown in FIGS. 3, 4 and 5, the housing 22 of the electronics subsystem 24 may further include at least one retaining feature, and even more preferably a plurality of such retaining features, which each form a flexible latching or retaining arm 22b (FIGS. 3 and 4) for removably retaining the keyboard 16 in the recess 20 of the housing 22. The retaining arms 22b may automatically engage with a corresponding plurality of slots or recesses 16a (FIGS. 3 and 5) formed in a perimeter of the housing of the keyboard 16 when the keyboard 16 is gently pressed down into the recess 20. The retaining arms 22b may be spaced around an interior wall 22c of the periphery of the recess 20 of the housing 22. In one preferred implementation three such retaining arm/recess pairs 22b/16a are arranged so as to be present adjacent to the top and bottom edges of the interior wall 22c, and one each is present adjacent the left and right sides of the interior wall 22c of the recess 20 when the keyboard 16 is positioned in the recess 20. Of course, a greater or lesser plurality of retaining arm/recess pairs 22b/16a may be used to suit the needs of a specific application. In some instances only a single retaining arm/recess pair 22b/16a may be implemented.

The retaining arm/recess pairs 22b/16a, when uncoupled from one another, enable the keyboard 16 to be easily lifted out from the recess 20 in the housing 22. When positioned in the recess 20, the keyboard 16 may rest on rib portions 27 formed to project upwardly from the floor panel 26, which provide an added degree of clearance between the lower surface of the keyboard 16 and the floor panel to accommodate one or more cables coupled to the keyboard.

Assembly of the keyboard 16 into the electronics subsystem 24 may be accomplished by simply dropping the keyboard 16 into the recess 20 and exerting a slight downward pushing force to cause engagement of corresponding pairs of the retaining arms and recesses 22b/16a. Removal is as described above, that is, simply pushing up using one or more fingers extending through the openings 32a and 26a to uncouple the keyboard 16 from the retaining arms 22b. Thus no tools are required for either installation or removal of the keyboard 16.

As shown in FIGS. 2 and 3, another important feature of the KMM system 10 is that the attached keyboard 16 and electronics subsystem 24 can be easily removed from the tray subsystem 28. The tray portion 32 may include one or more hooks 32b (FIG. 2) formed in it (in this example two such hooks) which engage with corresponding recesses 22d along a lower rear edge 22e of the housing 22 when the electronics subsystem 24 is set on the tray portion 32 and then pushed rearwardly slightly toward the hooks 32b. FIG. 2 also illustrates a plurality of three threaded holes 32c in the tray portion 32 that engage with thumbscrews 22f, shown in FIG. 3 (one of the three thumbscrews 22f being hidden from view in FIG. 3).

Installation of the electronics subsystem 24 onto the tray subsystem 28 may be accomplished by first removing the keyboard 16 from the electronics subsystem 24. The electronics subsystem 24 may then be seated on the tray portion 32 and moved slightly rearwardly on the tray panel 32 toward the hooks 32b. As the hooks 32b engage the recesses 22d in the housing 22, the housing will be fully seated on the tray portion 32. At this point the thumbscrews 22f can then be threaded into the threaded holes 32c in the tray portion 32 and tightened down to secure the electronics subsystem 24 against movement relative to the tray portion 32. Removal of the electronics subsystem 24 from the tray subsystem 28 may be accomplished without any hand tools simply by first removing the keyboard 16 from the recess 20 to expose the thumbscrews 22f, then unscrewing the thumbscrews 22f, and then manually manipulating the electronics subsystem 24 away from the hooks 32b and lifting it off of the tray portion 32.

The easy tool-free removal and installation of the electronics subsystem 24 also significantly eases installation and removal of the KMM system 10 into and out from the equipment rack 12 by reducing the weight of the KMM system 10 that the installer is required to handle, and manipulate, to accomplish the installation or removal. Only handling of the tray subsystem 28 needs to be managed by an individual when installing the KMM system 10 or removing it from the equipment rack 12. This feature is also beneficial because if the electronics subsystem 24 or the keyboard 16 needs to be removed for replacement or service, it can easily be separated from the tray subsystem 28 and replaced, repaired or transported (i.e., shipped) to a service facility more easily and more inexpensively than what would be possible if the entire KMM system 10 had to be replaced, repaired or shipped as a single unit.

The electronics subsystem 24 may include whatever components are required to power its internal components, the monitor 14 and the keyboard 16, as well as to enable communications between the monitor and keyboard and the target device (e.g., target server). For example, such components may include, but are not limited to, a video controller PCBA, a Power Supply 24a (FIG. 3), a video and data connector PCBA, a user control panel, power distribution subassembly or PCBA, as well as audio input and/or output connectors.

With further reference to FIG. 2, the tray subsystem 28 in this example can be seen to include an AC power connector port 40, a "USB A" port 42, a "USB B" port 44, a DVI video connector port 46, a VGA video connector port 48, and a Display Port ("DP") video connector port 50. The jacks or ports 40-50 allow quick and easy connection of all relevant ports of the electronics subsystem 24 to the individual cables 40a (AC power), a first USB cable 42a, a second USB cable 44a, a DVI video cable 46a, a VGA video cable 48a and/or a Display Port (DP) video cable (not shown) that may be contained by the cable management system 35. And while an audio connector is not explicitly shown on the electronics subsystem 24, it will be appreciated that the electronics subsystem could readily include a suitable connector for connecting to an audio cable and enabling audio signals to be communicated between the electronics subsystem and a remote server. The inclusion of the ports 40-50 enables quick and easy interfacing of the electronics subsystem 24, the monitor 14 and the keyboard 16 to an AC power source as well as to the serial and video port(s) of a remote computing component, such as a remote server. Typically the remote server will be located in the same equipment rack 12 as the KMM system 10, but it will be appreciated that this is not absolutely required. Alternatively, it is possible that a KVM (Keyboard/Video/Mouse) appliance could be mounted in the same U space of the equipment rack directly behind the KMM system 10.

Figure 6:
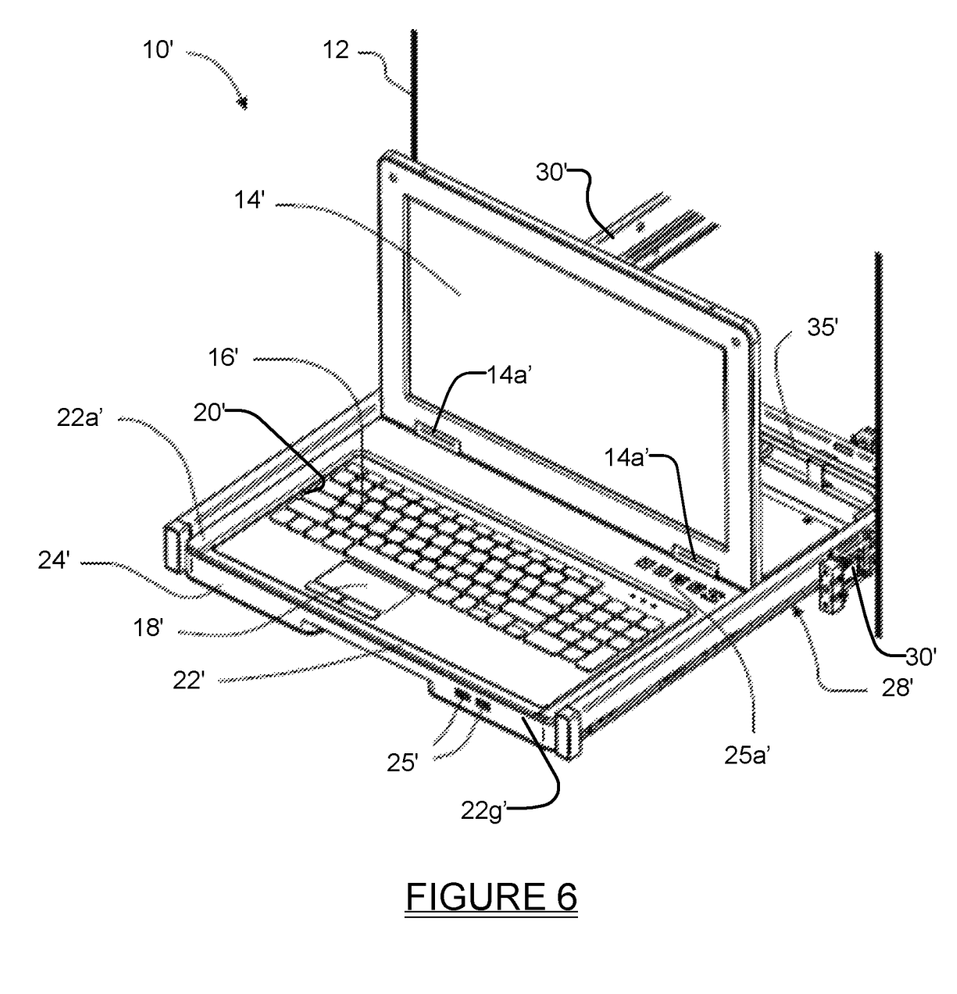
FIG. 6 is a perspective view of an alternative embodiment of a KMM system incorporating an extended keyboard.

FIG. 6 shows a KMM system 10' in accordance with another embodiment of the present disclosure. The KMM system 10' is substantially identical to the KMM system 10 with the exception that an extended keyboard 16' is substituted for the compact keyboard 16. Components and features of the KMM system 10' in common with those described above for the KMM system 10 have been denoted in FIG. 6 using the same reference number but with a prime (') designation. The attachment and removal of the extended keyboard 16' is the same as that described above for the compact keyboard 16.

While the KMM system 10 is expected to find significant utility in data centers, server rooms, and telecom infrastructure, the KMM system 10 is not necessarily limited to use in such applications but may be employed wherever a user needs to access or interact with a targeted device, which itself does not have a keyboard/mouse or terminal-like component for enabling user control. The KMM system 10 may also be installed in custom or specialized fixtures (closets, mobile environments, work stations, studios, etc.).

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A modular keyboard, monitor, mouse (KMM) system for use in an equipment rack, the system comprising:
   a tray subsystem;
   an electronics subsystem adapted to rest on and be removably secured to the tray subsystem, the electronics subsystem having a housing including a recess, the recess being shaped to nestably support an independent keyboard therein;
   a monitor pivotally supported from the electronics subsystem and movable between a first position, extending up from the electronics subsystem so as to be viewable for use by a user, to a second position for storage such that the monitor is positioned parallel to the housing of the electronics subsystem;
   the monitor adapted to cover at least a substantial portion of the independent keyboard positioned in the recess when the monitor is folded down into the second position for storage;
   wherein the electronics subsystem and the monitor are removable from the tray subsystem as a single assembly; and
   wherein the electronics subsystem includes:
      at least one user accessible control on a surface of the housing, adjacent the independent keyboard, when the independent keyboard is positioned within the recess of the housing, enabling user control over at least one of power on/off, configuration and settings; and
      a power supply for powering the monitor and internal components of the electronics subsystem.

2. The system of claim 1, further comprising the independent keyboard configured to rest nestably within the recess of the housing of the electronics subsystem.

3. The system of claim 1, further comprising a pair of slides for supporting the tray subsystem for linear sliding movement into and out from a mounting location within the equipment rack.

4. The system of claim 1, wherein:
   the recess of the housing of the electronics subsystem includes a first opening; and
   the tray subsystem includes a planar tray portion having a second opening aligned with the first opening to permit a finger of a user to access a bottom surface of the independent keyboard when the independent keyboard is positioned in the recess and to lift the independent keyboard at least partially out of the recess.

5. The system of claim 1, wherein one of the tray subsystem and the housing of the electronics subsystem includes a hook, and the other one of the tray subsystem and the housing includes a recess for engaging the hook, to enable the electronics subsystem to be removably secured on the tray subsystem.

6. The system of claim 1, wherein the recess of the housing of the electronics subsystem includes at least one retaining arm for engaging with the independent keyboard when the independent keyboard is positioned in the recess of the housing, to removably secure the independent keyboard within the recess of the housing.

7. The system of claim 1, wherein the housing of the electronics subsystem includes at least one USB port.

8. The system of claim 1, wherein the recess of the housing of the electronics subsystem includes a floor panel having an opening for enabling cabling from the independent keyboard to pass therethrough.

9. The system of claim 1, wherein the recess of the housing of the electronics subsystem includes a thumbscrew positioned therein, and the tray subsystem includes a planar tray portion having a threaded hole for engaging with the thumbscrew, to enable the electronics subsystem to be secured to the tray subsystem.

10. The system of claim 1, further comprising a cable management system secured to the tray subsystem, for supporting cabling, the cabling adapted to be coupled to the electronics subsystem when the electronics subsystem is positioned on the tray subsystem.

11. The system of claim 1, wherein the electronics subsystem includes a plurality of connectors along a lower rear edge portion thereof, the connectors including at least one of:
    a USB port;
    a DVI video connector;
    a VGA video connector;
    a Display port ("Dp") video connector; and
    an AC power connector port.

12. The system of claim 1, wherein the recess of the housing of the electronics subsystem includes a floor panel, the floor panel having a plurality of rib portions upon which the independent keyboard rests when the keyboard is positioned within the recess, the rib portions providing clearance between a lower surface of the independent keyboard and the floor panel for cabling.

13. A modular keyboard, monitor, mouse (KMM) system for use in an equipment rack, the system comprising:
    a tray subsystem;
    a keyboard;
    a pair of slides for supporting the tray subsystem for sliding movement into and out from the equipment rack;
    an electronics subsystem, independent of the keyboard, and adapted to rest on and be removably secured to the tray subsystem, the electronics subsystem having:
       a housing including a recess, the recess being shaped to nestably support the keyboard therein;
       the housing including a rear edge having a plurality of electrical connectors;
       the housing including a control panel with a plurality of controls, and being disposed on an upper surface thereof adjacent the keyboard;
    a monitor pivotally supported from the electronics subsystem and movable between a first position, extending up from the electronics subsystem so as to be viewable for use by a user, to a second position for storage such that the monitor is positioned parallel to the housing of the electronics subsystem;
    the keyboard being removably secured to the electronics subsystem within the recess, the monitor covering at least a substantial portion of the keyboard when folded down into the second position for storage; and
    wherein the electronics subsystem and the monitor are removable from the tray subsystem as a single assembly.

14. The system of claim 13, wherein the recess of the housing of the electronics subsystem includes a retaining arm configured to engage with a portion of the keyboard when the keyboard is positioned in the recess, to releasably retain the keyboard within the recess of the housing.

15. The system of claim 13, wherein:
    the housing of the electronics subsystem includes a floor panel having a first opening; and
    the tray subsystem includes a planar tray portion having a second opening aligned with the first opening to permit a finger of a user to access a bottom surface of the keyboard when the keyboard is positioned in the recess and to lift the keyboard at least partially out of the recess.

16. The system of claim 13, further comprising a cable management system secured to the tray subsystem, for supporting cabling, the cabling adapted to be coupled to the electronics subsystem when the electronics subsystem is positioned on the tray subsystem.

17. The system of claim 13, wherein the housing of the electronics subsystem includes a USB port disposed on a forward edge portion of the housing.

18. The system of claim 13, wherein:
the housing of the electronics subsystem includes a floor panel;
wherein the tray subsystem includes a tray portion having a threaded hole; and
further comprising a thumbscrew positioned to engage with the threaded hole when the housing of the electronics subsystem is positioned on the tray subsystem.

19. The system of claim 13, wherein the keyboard comprises one of:
a compact keyboard; and
an extended keyboard.

20. A method for forming a modular keyboard, monitor, mouse (KMM) system for use in an equipment rack, the method comprising:
providing a tray subsystem;
securing the tray subsystem to an equipment rack for slidable movement out from an equipment location of the equipment rack, and back into the equipment location;
securing an electronics subsystem removably on the tray subsystem, the electronics subsystem including a location for supporting a keyboard releasably and nestably therein, and at least one control for enabling user control over at least one of power on/off, configuration and settings;
pivotally securing a monitor to the electronics subsystem such that the monitor is movable between:
a first position extending out from the electronics subsystem to enable the monitor to be positioned for viewing by a user; and
a second position wherein the monitor is folded down flush against the electronics subsystem for storage;
wherein the second position enables the tray subsystem with the electronics subsystem thereon, and a keyboard disposed on the electronics subsystem, to be slid into the equipment location of the equipment rack as a single assembly for storage; and
wherein the electronics subsystem and the monitor, are removable from the tray subsystem as a single assembly.

* * * * *